United States Patent [19]

Murrmann et al.

[11] 4,118,251

[45] Oct. 3, 1978

[54] PROCESS FOR THE PRODUCTION OF A LOCALLY HIGH, INVERSE, CURRENT AMPLIFICATION IN A PLANAR TRANSISTOR

[75] Inventors: Helmuth Murrmann, Ottobrunn; Ernst Wittenzellner, Munich, both of Germany

[73] Assignee: Siemens Aktiengesellschaft, Berlin & Munich, Germany

[21] Appl. No.: 739,730

[22] Filed: Nov. 8, 1976

[30] Foreign Application Priority Data

Dec. 3, 1975 [DE] Fed. Rep. of Germany ....... 2554426

[51] Int. Cl.² .................... H01L 21/265; H01L 21/26
[52] U.S. Cl. .................................... 148/1.5; 148/191; 357/34; 357/91
[58] Field of Search .................. 357/34, 91, 92; 148/1.5, 191, 175

[56] References Cited

U.S. PATENT DOCUMENTS

| | | | |
|---|---|---|---|
| 3,244,950 | 4/1966 | Ferguson | 317/235 |
| 3,655,457 | 4/1972 | Duffy et al. | 148/1.5 |
| 3,736,477 | 5/1973 | Berger et al. | 317/235 R |
| 3,756,873 | 9/1973 | Kaiser | 148/187 |
| 3,802,968 | 4/1974 | Ghosh et al. | 148/175 |
| 4,045,251 | 8/1977 | Graul et al. | 148/1.5 |

Primary Examiner—L. Dewayne Rutledge
Assistant Examiner—Upendra Roy
Attorney, Agent, or Firm—Hill, Gross, Simpson, Van Santen, Steadman, Chiara & Simpson

[57] ABSTRACT

A process for the production of a locally high inverse current amplification in a preferably double diffused or implanted inversely operated transistor which includes forming a low doped epitaxial layer of one conductivity type on a high doped semiconductor substrate of the same conductivity type, forming a high doped buried region by ion implantation in the epitaxial layer beneath the zone provided for the collector, forming a low doped second region of the opposite conductivity type, above said first region which covers an area substantially wider than said first region and forming a third high doped region in the surface of the epitaxial layer spaced above said first region and having an area smaller than said first region, the first region forming the emitter, the second region forming the base and the third region forming the collector, the second region extending to the surface surrounding said third region and partially surrounding the first region. A second low doped region may be provided as an injector by diffusing an impurity of the second conductivity type into a fourth region adjacent the surface of the epitaxial layer and laterally spaced from the second region.

6 Claims, 4 Drawing Figures

PROCESS FOR THE PRODUCTION OF A LOCALLY HIGH, INVERSE, CURRENT AMPLIFICATION IN A PLANAR TRANSISTOR

BACKGROUND OF THE INVENTION

The invention relates to a process for the production of a locally high, inverse current amplification (upwards current amplification) in a preferably double-diffused or implanted, inversely operated planar transistor which is arranged in a semiconductor body with an integrated circuit.

Digital circuits are known (Valvo-Reports, Volume XVIII, Edition 1/2 pages 215 to 226) which employ the so-called integrated injection logic ($I^2L$). The basic gate type of this technique requires only a very small crystal surface and the power loss can be kept extremely low. Bipolar, double-diffused or implanted transistors are used as switching elements. However, in contrast to a transistor of the usual planar technique in an inversely operated transistor, the emitter zone does not lie on the surface of the semiconductor body or an epitaxial layer deposited on a semiconductor substrate, but in the semiconductor body itself, that is to say beneath the surface of the epitaxially deposited layer. Thus an inversely operated npn-transistor has, for example, a n-conducting epitaxial layer, which normally forms the collector of a conventional transistor, forms the emitter, whereas the last $n^+$ diffusion which normally forms the emitter of the conventional transistor now serves as the collector. This means that the switching element of the $I^2L$ technique is an inversely operated bipolar npn-transistor in the conventional planar technique.

A fundamental advantage of the integrated injection logic consists in the high packing density which can be achieved on a semiconductor body for the integrated circuit. This is based on the fact that with a corresponding circuit concept, no mutual insulation is necessary. On the other hand, inversely operated transistors have a relatively small upwards current amplification, which here is referred to as upwards current amplification ($B_{up}$), which corresponds to the inverse current amplification in normal operation. The upwards current amplification could in fact be improved by a correspondingly high basic doping of the epitaxial layer. However, a high doping of this type is not very effective as it reduces the efficiency of a lateral pnp-transistor as injector (see Valvo-Reports, Vol. 18, Edition 1/2, pages 216 and 217) and at the same time increases the emitter-base-capacitance of the $I^2L$- transistor.

SUMMARY OF THE INVENTION

It is an object of the present invention to provide a novel inversely operated transistor which exhibits a high upward current amplification even in the case of a low-doped and high-ohmic epitaxial layer or in the case of a high-ohmic semiconductor substrate.

This object is attained in accordance with the invention in that prior to the base doping ions are implanted into the semiconductor body beneath the zone provided for the collector, and during following temperature treatments diffuse out into the adjacent zones.

The process in accordance with the invention allows the injector to be fully effective and at the same time permits a high upwards current amplification. As a result of the higher local doping introduced by ion implantation merely beneath the "active" base surface, the parasitic capacitance between the aforesaid base surface and the aforesaid emitter surface is likewise lower than with an increased basic doping of the overall epitaxial layer and of the substrate. This results in a substantial improvement in the speed-power product, which on the one hand is based on the high injector efficiency with a nevertheless adequate forwards current amplification and on the other hand on a reduction in the parasitic base-emitter-capacitance in relation to an overall increase in the doping.

BRIEF DESCRIPTION OF THE DRAWINGS

A preferred embodiment of the present invention is illustrated by the drawings, in which.

DESCRIPTION OF THE PREFERRED EMBODIMENTS

Figure 1:
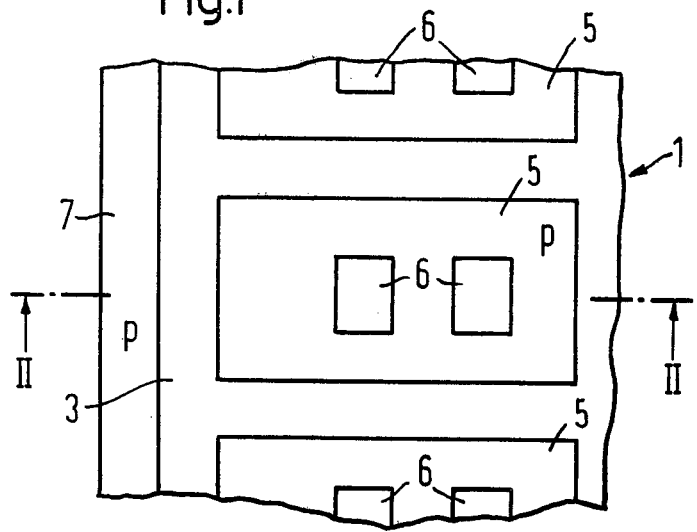
FIG. 1 is a fragmentary plan view of an inversely operated transistor embodying the present invention.

A semiconductor body 1 consists of an $n^{++}$ conducting semiconductor substrate having therein a buried layer 2. Above the layer 2 is an epitaxially deposited layer 3 of $n$ type conductivity. The epitaxially deposited layer 3 has, for example, a layer thickness of 5 $\mu m$ and a specific resistance of 0.8 $\Omega cm$ corresponding to a doping of approximately $10^{16}$ atoms·$cm^{-3}$. In this connection, see the horizontal line 31 in FIGS. 3 and 4. The doping course of the semiconductor substrate 2 is indicated by a curve 32 in FIGS. 3 and 4.

Figure 4:
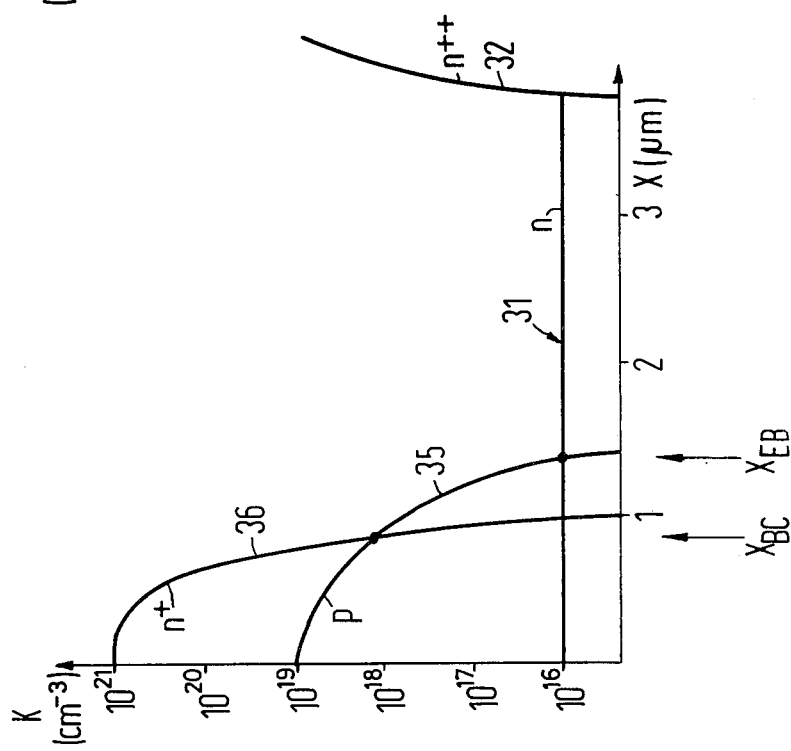
FIG. 4 is the doping force in a section IV—IV of FIG. 2 corresponding to FIG. 3.

Using ion implantation, $n^+$ conducting zones are introduced into the epitaxially deposited layer 3 into those zones which are later covered by the collectors. The ions are implanted for example with 100 keV. As a result of a post-diffusion, the implanted ions penetrate deeper into the epitaxially deposited layer 3, so that the zones 4 which they form assume the course shown in broken lines in FIG. 2. FIG. 4 shows in broken lines the doping course of the implanted ions following the implantation in the form of a broken line curve 41.

Figure 3:
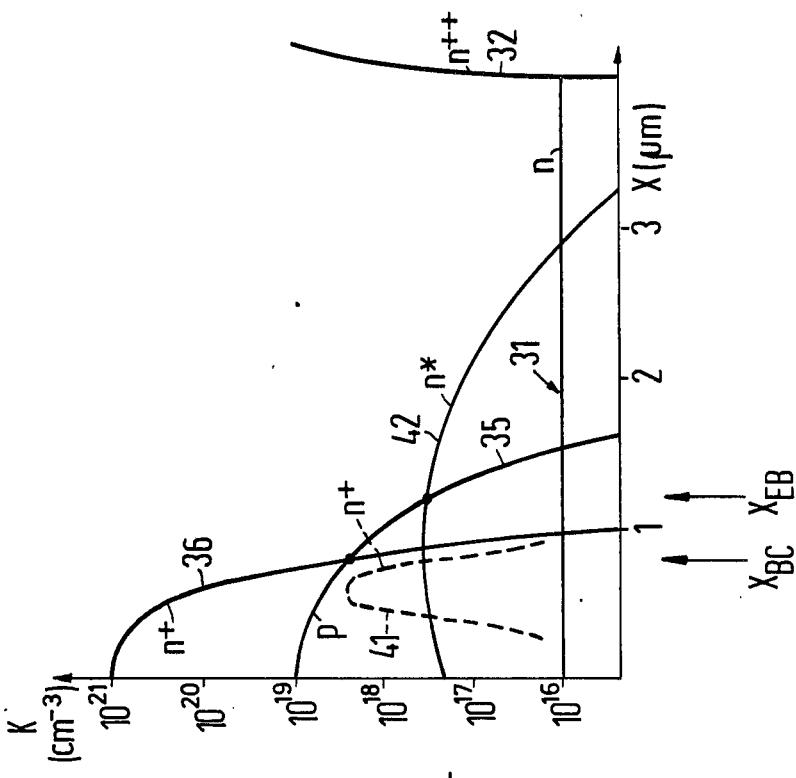
FIG. 3 is a graph showing the doping course in a section III—III of FIG. 2 where the penetration depth $x$ is shown in $\mu m$ on the abscissa (compare arrow $x$ in FIG. 2) and the doping concentration K in atoms·$cm^{-3}$ is plotted on the ordinate.

Then, in a known manner, the base is doped with boron by diffusion or ion implantation, so that a p-conductive zone 5 with the emitter-base junction is formed at the penetration depth $x_{EB}$ (see FIGS. 3 and 4). At the same time the p-conducting zone 5 is being formed, the injector zone 7 may be conveniently formed. If desired, the p-conducting zone 7 may be formed as the injector by diffusion in the n-conducting layer 3. Finally, in the zone 5, an $n^+$ conducting zone 6 is produced as collector with the base-collector junction at the penetration depth $x_{BC}$ (see FIGS. 3 and 4) by means of diffusion or implantation. The zone 6 has a penetration depth of approximately 1 $\mu m$. The doping course of the zone 5 and of the zone 6 is referenced 35 and 36, respectively in FIGS. 3 and 4.

During the base doping, a possible post-diffusion and the doping of the collector, the doping which has been introduced by means of ion implantation (see Curve 41 in FIG. 4) diffuses out, so that after these temperature treatments a doping course is formed as illustrated by the curve 42 in FIG. 4.

Figure 2:
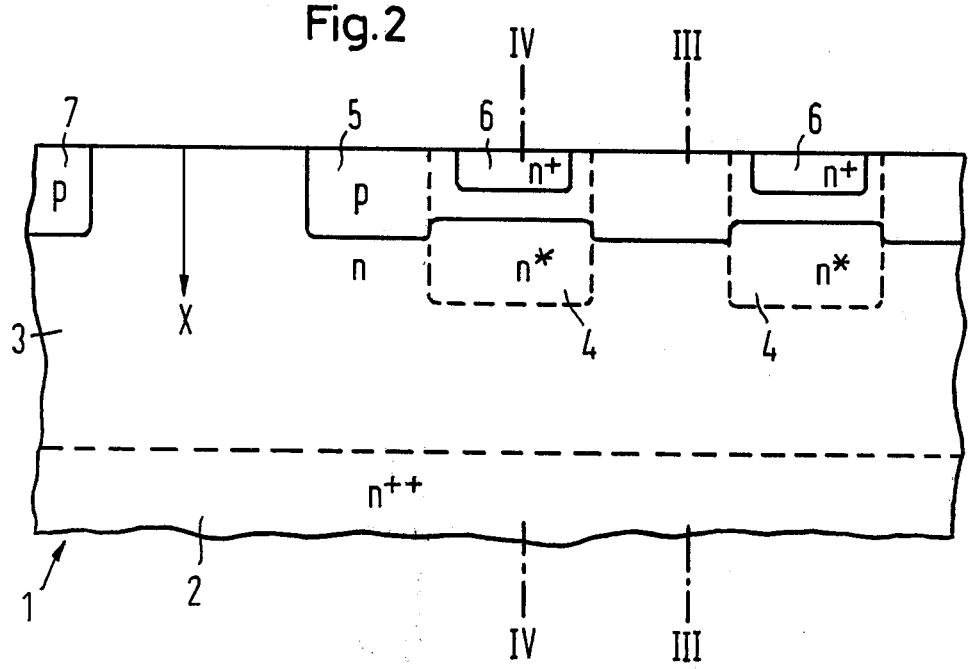
FIG. 2 is an enlarged fragmentary sectional view taken along the line II—II of FIG. 1.

FIG. 3 shows the doping course in a section III—III of FIG. 2 without the zone 4, and FIG. 4 shows the doping course in a section IV—IV with the zone 4. Beneath the collector 6, thus at the point of the actual, inversely operated transistor, the epitaxial layer 3 has a higher doping which produces a good emitter efficiency and thus a good upwards current amplification.

It will be apparent to those skilled in the art that many modifications and variations may be effected without departing from the spirit and scope of the novel concepts of the present invention.

We claim as our invention:

1. A process for the production of a locally high, inverse current amplification in a preferably double-diffused or implanted, inversely operated planar transistor, which is provided in a semiconductor body with an integrated circuit, which comprises forming an epitaxial layer of one conductivity type on a high doped semiconductor substrate of the same conductivity type, implanting ions into said semiconductor body beneath the zone provided for the collector, subjecting said substrate to temperature treatment, thereby causing ions to diffuse out into the adjoining zones.

2. A process as claimed in claim 1 with which an npn-transistor is produced, wherein the ions implanted into the semiconductor body beneath the zone provided for the collector are subjected to a post-diffusion, and that subsequently the base doping is carried out by the diffusion or implantation of boron.

3. A process as claimed in claim 2, wherein an N-conducting epitaxial layer on a semiconductor substrate which is $n^{++}$ conducting on its surface provides the semiconductor body.

4. A process as claimed in claim 3, wherein the ions are implanted with an energy of approximately 100 keV and after the post-diffusion at a penetration depth of approximately 2.5 $\mu$m exhibit a concentration of approximately $2 \cdot 10^{17}$ to $10^{18}$ cm$^{-3}$ at the base-emitter junction.

5. A process for the production of a locally high, inverse current amplification in a preferably double-diffused or implanted, inversely operated planar transistor, which is provided in a semiconductor body with an integrated circuit, which comprises forming an epitaxial layer of one conductivity type on a high doped semiconductor substrate of the same conductivity type, implanting ions of said one conductivity type into said semiconductor body to form an emitter region with high doping beneath the zone provided for the collector, forming a base region by diffusion or ion implantation of the opposite conductivity type in said epitaxial layer above said emitter region to thereby form an emitter-base junction, said base region extending laterally beyond a projection of said emitter region, and forming a collector region in said epitaxial layer above said emitter region with a portion of the base region lying therebetween, and subjecting said substrate to temperature treatment, thereby causing ions to diffuse out into the adjoining zones.

6. A process for the production of a locally high, inverse current amplification inversely operated planar transistor which comprises forming an epitaxial semiconductor layer doped with an impurity of a first type on a semiconductor body having a higher doping of the same impurity type, locally forming a buried region of high impurity of said first type by ion implantation below the surface of said epitaxial layer, forming a second doped region of the opposite impurity type above said buried region which forms an emitter-base junction between said buried layer and said oppositely doped second region, said second region extending laterally beyond said first buried region, and forming a third highly doped region in the surface of said second region of the first impurity type, said second region completely surrounding said third region and an upper portion of said first region, said first region being wider than said third region and centrally aligned therewith.

* * * * *